May 18, 1965 E. J. PETERSEN 3,184,612

PULSE-GENERATING COUNTER WITH SUCCESSIVE STAGES COMPRISING BLOCKING OSCILLATOR AND "AND" GATE FORMING CLOSED AND OPEN LOOPS

Filed Oct. 10, 1962

3 Sheets-Sheet 1

INVENTOR.
EARL J. PETERSEN

BY S. J. Rotondi
A. J. Dupont & S. Pechoff
ATTORNEYS

May 18, 1965

E. J. PETERSEN 3,184,612

PULSE-GENERATING COUNTER WITH SUCCESSIVE STAGES COMPRISING BLOCKING OSCILLATOR AND "AND" GATE FORMING CLOSED AND OPEN LOOPS

Filed Oct. 10, 1962

3 Sheets-Sheet 2

INVENTOR.
EARL J. PETERSEN
BY S. J. Rotondi,
A. J. Dupont & S. Dubroff
ATTORNEYS May 18, 1965

E. J. PETERSEN 3,184,612

PULSE-GENERATING COUNTER WITH SUCCESSIVE STAGES COMPRISING BLOCKING OSCILLATOR AND "AND" GATE FORMING CLOSED AND OPEN LOOPS

Filed Oct. 10, 1962

3 Sheets-Sheet 3

INVENTOR.
EARL J. PETERSEN
BY S. J. Rotondi,
A. J. Dupont & S. Dubroff
ATTORNEYS 3,184,612

PULSE-GENERATING COUNTER WITH SUCCESSIVE STAGES COMPRISING BLOCKING OSCILLATOR AND "AND" GATE FORMING CLOSED AND OPEN LOOPS

Earl J. Petersen, Bountiful, Utah, assignor, by mesne assignments, to the United States of America as represented by the Secretary of the Army Filed Oct. 10, 1962, Ser. No. 229,771
7 Claims. (Cl. 307—88.5)

Figure 1:
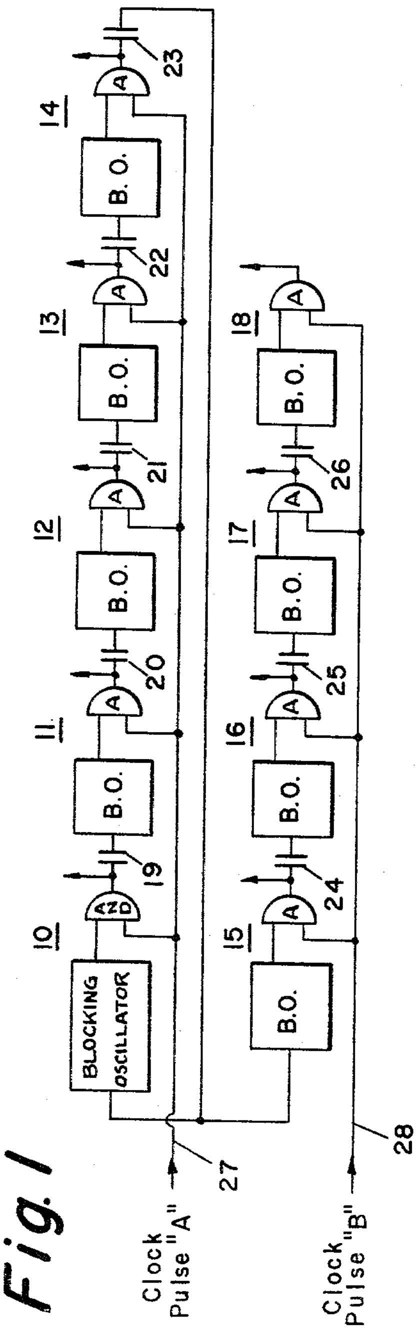

This invention relates to counters for generating a series of synchronized electrical pulses such as are useful in programming the operations of various types of devices or systems. The counter of the present invention is of the transistorized type. As utilized to synchronize the various operations of a Doppler radar system, it has the advantage that it permits a very low time jittered synchronizing pulse to be generated.

Heretofore, magnetic beam switching tubes have been utilized to generate the pulses required to synchronize the operation of a radar system. The use of such tubes, however, has been less than satisfactory for the reason that it involved (1) a pulse time jitter on the order of 40 to 150 millimicroseconds, and (2) magnetron type white noise was encountered in the range from kilocycles to 10 kilomegacycles. The present invention provides a counter which avoids these difficulties.

As constructed, the counter of the present invention functions to divide an input frequency by 10. This is accomplished with only five counting units since the counting unit inputs are preceeded by a bi-stable multivibrator which halves the input frequency. The input frequency has to be converted to a series of pulses which drive the multivibrator to obtain two symmetrical square wave outputs which are of opposite polarity and one half the input frequency. These pulses are hereinafter called the "A" and "B" clock pulses.

As will appear, each counting unit includes a blocking oscillator and an "and" gate. The "and" gate is opened by operation of the blocking oscillator permitting a clock pulse to pass through for use as a synchronized output pulse and as a trigger for the blocking oscillator in the next counting unit. The counting units are connected to form closed and open loops opposed in phase. The closed loop is initially triggered by a positive current supplied to the base of the transistor in the first counting unit of the loop, and obtained from the positive voltage supply by a resistor-capacitor-diode network.

The invention will be better understood from the following description when considered in connection with the accompanying drawings and its scope is indicated by the appended claims.

Figure 3:
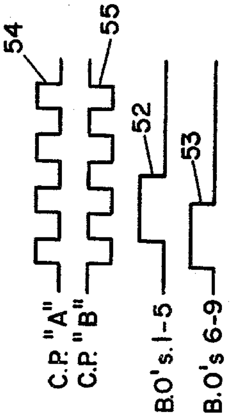
Figure 2:
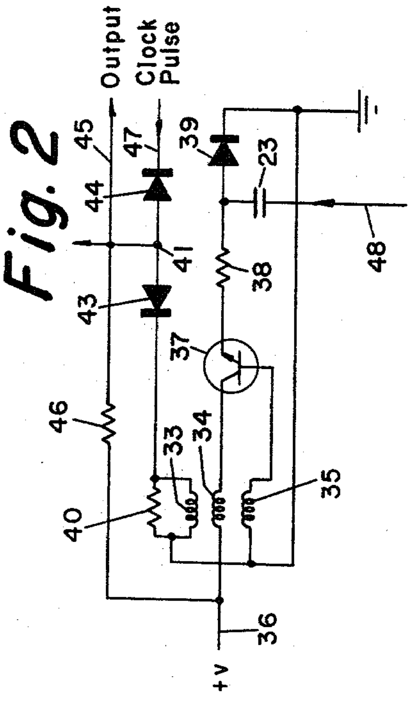
Figure 4A:
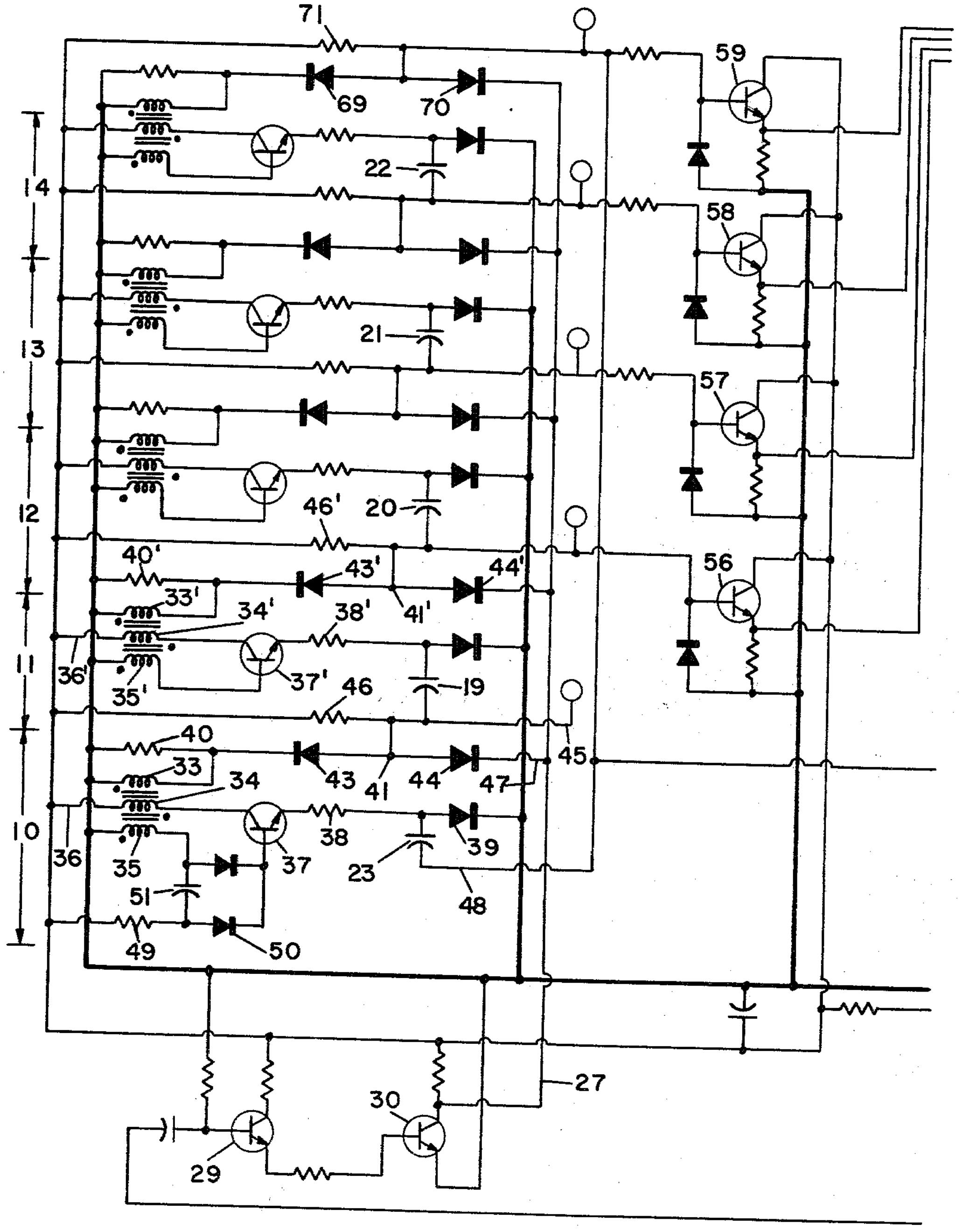
Figure 4B:
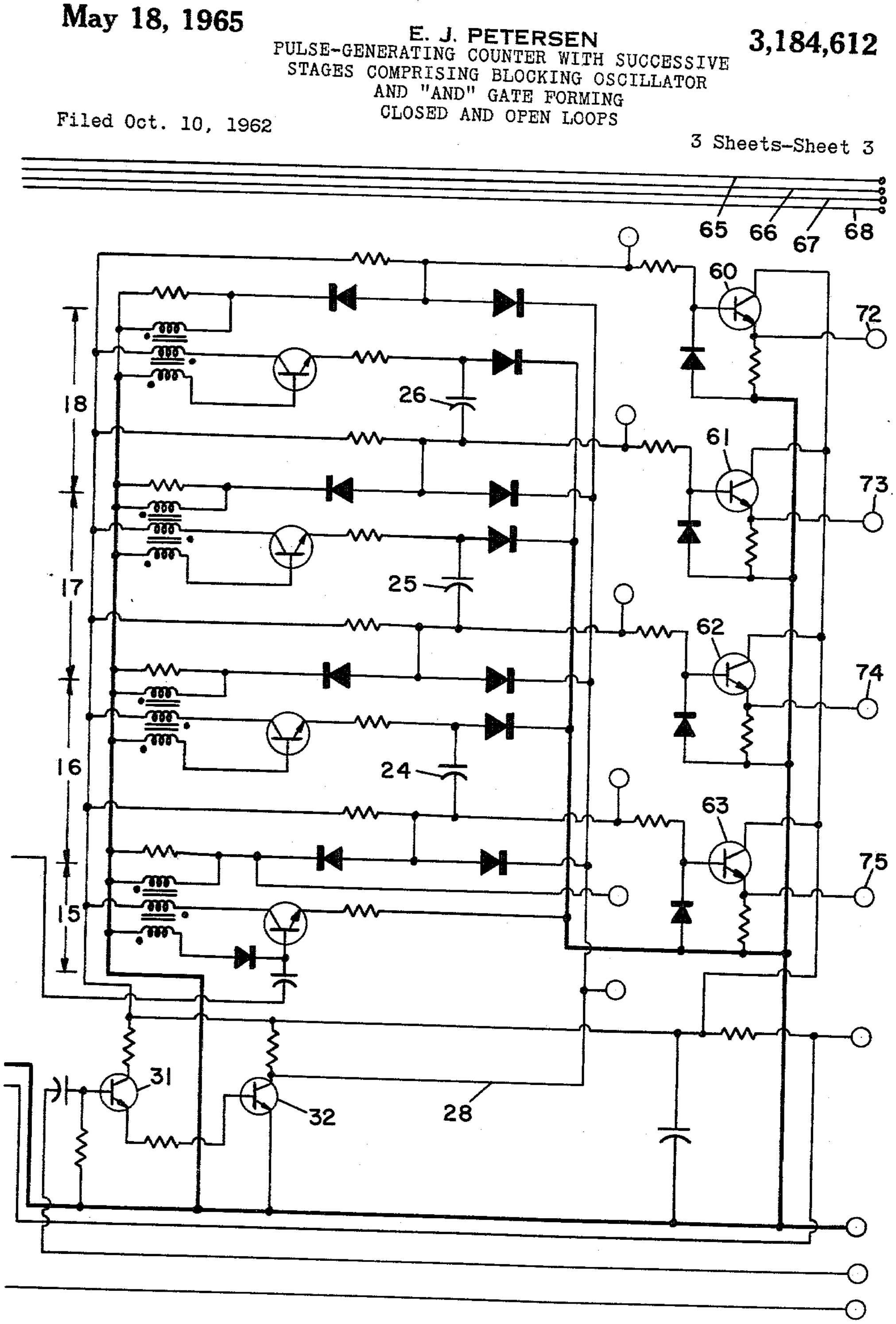

Referring to the drawings:

FIG. 1 is a block diagram of the counter, the blocking oscillators of the various counting units being designated by the letters B.O. and the "and" gates of these units being designated by the letter A, FIG. 2 is a wiring diagram of one of the counter units, FIG. 3 is a timing diagram indicating the relation between the various pulses involved in the operation of the counter, and FIGS. 4A and 4B constitute a wiring diagram of the counter.

As illustrated by FIGS. 1, 4A and 4B the counter includes units 10 to 14 which are connected in a closed loop, and units 15 to 18 which are connected in an open loop. Each of these units includes a blocking or bistable oscillator B.O. and an "and" gate A. These various units are coupled together by capacitors 19 to 26. Clock pulses "A" (FIG. 3) are applied to the closed loop through an input lead 27 and clock pulses "B" are applied to the open loop through an input lead 28. It is to be noted that the "A" and "B" clock pulses are symmetrical square waves which are of opposite polarity and one half the input frequency. These clock pulses are processed respectively by transistor groups 29–30 (FIG. 4) and 31 and 32 to clamp the bottom of their square outputs to ground potential by saturation of transistors 30 and 32. Thus the "A" clock square wave pulses are used to synchronize the action of the closed loop of five counting units, and the similar "B" clock pulses are used to synchronize the action of the open loop of four counting units.

All of the counting units are alike. As indicated by FIG. 2, each of them includes a blocking oscillator having an input winding 34 and a pair of output windings 33 and 35. The input winding 34 is connected between a current input lead 36 and ground through a transistor 37, a resistor 38 and a diode 39. The output winding 35 is connected between ground and the base of the transistor 37. The output winding 33 is shunted by a resistor 40 and is connected between ground and one terminal of an "and" gate which is formed by diodes 43 and 44 and a resistor 46 (FIG. 4). Pulses for triggering the unit are derived from an "and" gate of the previous unit and are applied through capacitor 23 at the junction between the resistor 38 and the diode 39. The output lead 45 of the counting unit is connected to the output lead of the "and" gate 43–44–46. Positive potential is applied to the counting unit through a lead 36 and clock pulses are applied through a lead 47. Pulses generated by the "and" gate of the preceding stage are applied to lead 48.

In order for the counter to function as desired, it is essential that current be flowing into the base of the transistors of one of the units or stages. This is accomplished in the case of the unit 10 initially by transmitting current through a resistor 49 and a diode 50 (FIG. 4) to the base of the transistor 37. This starts the blocking oscillator producing an output pulse which biases off the diode 43. The "A" clock pulse applied through the lead 47 biases off the diode 44. Interruption of the current of diodes 43 and 44 results in a more positive potential at the "and" gate junction 41. The positive potential decreases when the blocking oscillator or clock pulse stops and current again flows through the resistor 46. The fall time of the resulting pulse is differentiated by the capacitor 19, and the negative pulse so produced is utilized to trigger the next counting unit 11.

Corresponding parts of units 10 and 11 are generally indicated by the same reference numerals, the reference numerals of stage 11 being primed. The operation of the two units is similar. Thus with the blocking oscillator of the unit 11 triggered by the output of unit 10, the diodes 43′ and 44′ are biased off and the junction 41′ is at a more positive potential. When the blocking oscillator and "A" clock pulse stop, current is drawn through resistor 46′ and the capacitor 20 functions to differentiate the resulting pulse and apply it to the input of unit 12. The operation of units 12 to 18 is similar to that of unit 11 and is readily understood without further explanation.

The blocking oscillator pulses 52 and 53 (FIG. 3) are about two and one half times as long as one clock pulse. Since they start at the fall time of a clock pulse 54 or 55, only one positive going clock pulse can coincide at the "and" gate with the blocking oscillator pulse. Therefore the "and" gate pulse coincides with one clock pulse. The next clock pulse is selected by the next counting unit and this is repeated throughout the operation of the counter. Besides furnishing negative trigger pulses to the next counting units, the "and" gate pulses are used for synchronized outputs through emitter follower transistors 56 to 63 (FIG. 4).

The "A" clock synchronized closed loop of five counting units can only supply at gate terminals 65 to 68 outputs coinciding with the positive going 15 microsecond pulses of the "A" clock. In order to obtain output pulses in the 15 microsecond intervals left by the "A" clock loop, the "B" clock open loop is used. It is triggered from the leading edge of the "A" clock pulse selected by the "and" gate consisting of diodes 69 to 70 and resistor 71. This operates the "B" clock open loop counting units 15 to 18 15 microseconds out of phase with the "A" clock counting units 10 to 14. The 150 microsecond repetition is thus divided into ten intervals. This makes 15 microsecond outputs available during all times excepting that of the fifth open loop counting unit which is omitted because it was not needed. If the loop trigger fails for some reason, the charge on capacitor 51 is reversed by the current through resistor 49 and the blocking oscillator fires again. Without synchronizing clock pulses, the closed loop operates with a loop period consisting of the sum of the five blocking oscillator pulse periods.

The trailing edge of the output pulse from transistor 63 is gate 75 and is defined as time zero or $T_0$. Six outputs are selected to cover the time from $T_0+15$ microseconds to $T_0+105$ microseconds. These are gates 74, 73, 72, 68, 67 and 66 and serve as range gates for six boxcar detectors in the range search channels of a radar sytem. Gates 65 and 75 are routed to trigger a pair of amplifiers. It is to be understood, however, that this is only one of many possible uses to which the counter of the present invention may be applied.

I claim:

1. A pulse generating counter comprising in combination,
   a plurality of counting units connected to form an open loop and a closed loop wherein of said units includes an "and" gate having signal and pulse inputs and a signal output and a blocking oscillator having a signal output connected to the signal input of the "and" gate and a signal input connected to the signal output of the "and" gate of a next preceeding unit,
   means providing a circuit connection from an intermediate "and" gate output in the series to the oscilator input of a preceding and initial unit of said series to form a closed loop followed by an open loop in said counter,
   means for energizing the oscillators of said units,
   means for simultaneously applying clock pulses to the "and" gate pulse inputs of said open loop,
   means for simultaneously applying to the "and" gate inputs of said closed loop clock pulses which opposed in phase the clock pulses applied to the "and" gate pulse inputs of said open loop, and
   means for clamping the bottoms of said clock pulses to ground potential.

2. A pulse-generating counter comprising in combination,
   means for applying square-wave clock pulses, and
   a plurality of counting units connected in a consecutive series, each of said units comprising
   a blocking oscillator having an output and having an input through which it receives trigger pulses from a preceeding counting unit and "and" gate having an output and having pulse and signal inputs connected to be actuated respectively by said clock pulses and the output of said oscillator to trigger the following unit, means providing a circuit connection from an intermediate "and" gate output to the oscillator input of a preceding and initial unit, thereby to provide a closed loop followed by an open loop in said series of units, said clock pulses being in phase opposition in their application to the pulse inputs of the closed and open loops, and means for deriving output signal pulses from said closed and open loops in time-sequential relation to each other.

3. A counter according to claim 2 wherein a plurality of output gates are provided for said counter and, wherein said trigger pulses are applied through emitter follower transistors to the output gates of said counter.

4. A counter according to claim 2, wherein said clock pulses have their bottoms clamped to ground potential by the saturation of a transistor oscillator in each counting unit.

5. A counter according to claim 2, wherein each blocking oscillator comprises a coupling transformer and a transistor oscillator element having a base and a collector-emitter circuit, said transformer having an input winding connected in the collector-emitter circuit of said transistor element and a pair of output windings one of which is connected with the "and" gate of the following unit to apply trigger pulses thereto and the other of which is connected to apply feedback to the base of said transistor element.

6. A counter according to claim 5, wherein the emitter side of the collector-emitter circuit includes a series resistor element followed by a diode element in connection with circuit ground, and wherein an input connection is provided for applying trigger pulses between said resistor and diode elements.

7. A pulse-generating counter comprising in combination,
   a plurality of counting units connected in a consecutive series,
   each of said units including an "and" gate having signal and pulse inputs and a signal output and a blocking oscillator having an output connected to the signal input of the "and" gate for the unit and having an input connected to the signal output of the "and" gate of a preceding unit,
   means providing a circuit connection from an intermediate "and" gate output in the series to the oscillators input of a preceding and initial unit of said series to form a closed loop followed by an open loop in said counter,
   means for energizing the oscillators of said units,
   means for simultaneously applying clock pulses to the "and" gate pulse inputs of said open loop,
   means for simultaneously applying to the "and" gate pulse inputs of the closed loop clock pulses which oppose in phase the clock pulses applied to the "and" gate pulse inputs of the open loop,
   means for deriving from the closed loop a series of output pulses, and
   means for deriving through the open loop a series of output pulses related in time sequence to the first series.

References Cited by the Examiner

UNITED STATES PATENTS

| | | | |
|---|---|---|---|
| 3,001,087 | 9/61 | Harloff | 307—88.5 |
| 3,035,187 | 5/62 | Reichert | 307—88.5 |
| 3,051,855 | 8/62 | Lee | 307—88.5 |
| 3,081,405 | 3/63 | Hovey et al. | 307—88.5 |
| 3,083,305 | 3/63 | Maley | 328—43 X |

ARTHUR GAUSS, *Primary Examiner.*